(12) United States Patent
Moon et al.

(10) Patent No.: US 9,318,573 B2
(45) Date of Patent: Apr. 19, 2016

(54) FIELD EFFECT TRANSISTOR HAVING GERMANIUM NANOROD AND METHOD OF MANUFACTURING THE SAME

(71) Applicant: Samsung Electronics Co., Ltd., Suwon-Si, Gyeonggi-Do (KR)

(72) Inventors: Chang-Wook Moon, Seoul (KR); Joong S. Jeon, Seongnam-si (KR); Jung-hyun Lee, Yongin-si (KR); Nae-In Lee, Seoul (KR); Yeon-Sik Park, Suwon-si (KR); Hwa-Sung Rhee, Seongnam-si (KR); Ho Lee, Cheonan-si (KR); Se-Young Cho, Seoul (KR); Suk-Pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 13/973,584

(22) Filed: Aug. 22, 2013

(65) Prior Publication Data
US 2013/0344664 A1 Dec. 26, 2013

Related U.S. Application Data

(62) Division of application No. 12/010,806, filed on Jan. 30, 2008, now abandoned.

(30) Foreign Application Priority Data

May 3, 2007 (KR) .................. 10-2007-0043025

(51) Int. Cl.
*H01L 21/02* (2006.01)
*H01L 29/66* (2006.01)
(Continued)

(52) U.S. Cl.
CPC ........... *H01L 29/66439* (2013.01); *B82Y 10/00* (2013.01); *H01L 21/02356* (2013.01);
(Continued)

(58) Field of Classification Search
CPC ............... H01L 29/66439; H01L 29/0665; H01L 29/0673; H01L 29/66742; H01L 29/78684; H01L 21/02601; H01L 21/02365; H01L 29/0669; H01L 51/426; H01L 2221/1094; B82Y 10/00; B82Y 15/00
USPC .......... 438/142, 149, 151; 977/762, 763, 902, 977/936, 938
See application file for complete search history.

(56) References Cited

U.S. PATENT DOCUMENTS 3,553,540 A * 1/1971 Puterbaugh, Jr. ............. 257/252
4,203,123 A 5/1980 Shanks
(Continued)

FOREIGN PATENT DOCUMENTS

JP 09-107095 A 4/1997
JP 2005-079517 A 3/2005
(Continued)

OTHER PUBLICATIONS

Hanrath et al. Germanium nanowire transistors: a comparison of electrical contacts patterned by electron beam lithography and beam-assisted chemical vapor deposition. Proc. IMechE vol. 218 Part N:1: Nanoengineering and Nanosystems, 2005, pp. 25-34.*
(Continued)

*Primary Examiner* — Galina Yushina
(74) *Attorney, Agent, or Firm* — Harness, Dickey, & Pierce, P.L.C.

(57) ABSTRACT

A field effect transistor having at least one Ge nanorod and a method of manufacturing the field effect transistor are provided. The field effect transistor may include a gate insulation layer formed on a silicon substrate, at least one nanorod embedded in the gate insulation layer having both ends thereof exposed, a source electrode and a drain electrode connected to opposite sides of the at least one Ge nanorod, and a gate electrode formed on the gate insulation layer between the source electrode and the drain electrode.

13 Claims, 7 Drawing Sheets

(51) Int. Cl.
  *B82Y 10/00* (2011.01)
  *H01L 29/10* (2006.01)
  *H01L 29/78* (2006.01)
  *H01L 29/786* (2006.01)
  *H01L 51/42* (2006.01)
  *H01L 29/06* (2006.01)
  *B82Y 15/00* (2011.01)

(52) U.S. Cl.
  CPC ...... *H01L21/02601* (2013.01); *H01L 29/0665* (2013.01); *H01L 29/0673* (2013.01); *H01L 29/1033* (2013.01); *H01L 29/66742* (2013.01); *H01L 29/7839* (2013.01); *H01L 29/78684* (2013.01); *B82Y 15/00* (2013.01); *H01L 29/0669* (2013.01); *H01L 51/426* (2013.01); *H01L 2221/1094* (2013.01)

(56) References Cited

U.S. PATENT DOCUMENTS

| | | | |
|---|---|---|---|
| 6,504,292 | B1 | 1/2003 | Choi et al. |
| 6,882,051 | B2 | 4/2005 | Majumdar et al. |
| 7,332,740 | B2 | 2/2008 | Park et al. |
| 7,378,711 | B2 | 5/2008 | Suh et al. |
| 7,425,487 | B2 | 9/2008 | Kreupl et al. |
| 7,696,022 | B2 | 4/2010 | Ikeda |
| 7,714,386 | B2 | 5/2010 | Pesetski et al. |
| 7,910,917 | B2 | 3/2011 | Ernst et al. |
| 7,972,930 | B2 | 7/2011 | Jang et al. |
| 2003/0162348 | A1 | 8/2003 | Yeo et al. |
| 2004/0036128 | A1 | 2/2004 | Zhang et al. |
| 2004/0166642 | A1* | 8/2004 | Chen et al. ............ 438/284 |
| 2004/0238887 | A1 | 12/2004 | Nihey |
| 2005/0121706 | A1 | 6/2005 | Chen et al. |
| 2006/0169788 | A1 | 8/2006 | Empedocles et al. |
| 2006/0252276 | A1 | 11/2006 | Choi et al. |
| 2007/0017439 | A1* | 1/2007 | Xianyu et al. ............ 117/108 |
| 2007/0114593 | A1 | 5/2007 | Radosavljevic et al. |
| 2007/0145482 | A1* | 6/2007 | Park et al. ............ 257/347 |
| 2008/0237575 | A1* | 10/2008 | Jin et al. ............ 257/19 |
| 2009/0127584 | A1* | 5/2009 | Morand et al. ............ 257/192 |

FOREIGN PATENT DOCUMENTS

| | | | | |
|---|---|---|---|---|
| JP | 2005079277 | A | 3/2005 | |
| JP | 2006237313 | A | 9/2006 | |
| KR | 20040098673 | A | 11/2004 | |
| KR | 20050049866 | A | 5/2005 | |
| KR | 20060027493 | A | 3/2006 | |
| WO | WO 2006131615 | * | 12/2006 | ............ H01L 21/336 |
| WO | WO-2006131615 | A1 | 12/2006 | |

OTHER PUBLICATIONS

Sung-Young Lee, et al., "A Novel Multibridge-Channel MOSFET (MBCFET): Fabrication Technologies and Characteristics," IEEE Transactions on Nanotechnology, vol. 2, No. 4, pp. 253-257 (Dec. 2003).

T. Tezuka, et al., "Fabrication of strained Si on an ultrathin SiGe-on-insulator virtual substrate with a high-Ge fraction," Appl. Phys. Lett., vol. 79, No. 12, pp. 1798-1800 (2001).

Sung Dae Suk, et al, "High Performance 5nm radius Twin Silicon Nanowire MOSFET (TSNWFET): Fabrication on Bulk Si Wafer, Characteristics, and Reliability," Device Research Team, APD Team, PD Team, R&D Center, Samsung Electronics Co., (SAIT), Gyeonggi-do, Republic of Korea (2005).

N. Singh, et al., "High-Performance Fully Depleted Silicon Nanowire (Diameter< 5 nm) Gate-All-Around CMOS Device," IEEE Electron Device Letters, vol. 27, No. 5, pp. 383-386 (May 2006).

Josh Goldberger, et al., "Silicon Vertically Integrated Nanowire Field Effect Transistors," Nano Letters, vol. 6, No. 5, pp. 973-977 (Mar. 30, 2006).

King-Jien Chui, et al., "Source/Drain Germanium Condensation for P-Channel Strained Ultra-Thin Body Transistors," Silicon Nano Device Lab, Dept. of Electrical and Computer Engineering, National University of Singapore, Singapore (2005).

Hanrath et al. "Germanium nanowire transistors: a composition of electrical contacts patterned by electrode beam lithography and beam-assisted chemical vapor deposition". Proceedings of the Institution of Mechanical Engineers, Part N: Journal of Nanoengineering and Nanosystems, (2005), pp. 25-34.

Morales et al. "A Laser Ablation Method for the Synthesis of Crystalline Semiconduductor Nanowires". Science, vol. 279, Jan. 1998, pp. 208-211.

Office Action issued Mar. 5, 2013 in Japanese Application No. 2008-109493, with English Translation.

Office Action dated Apr. 29, 2013 issued in corresponding Korean Application No. 10-2007-0043025, with English Translation.

* cited by examiner

FIELD EFFECT TRANSISTOR HAVING GERMANIUM NANOROD AND METHOD OF MANUFACTURING THE SAME

PRIORITY STATEMENT

This application is a divisional application of U.S. application Ser. No. 12/010,806, filed Jan. 30, 2008, which claims priority under 35 U.S.C. §119 to Korean Patent Application No. 2007-0043025, filed on May 3, 2007, in the Korean Intellectual Property Office (KIPO), the entire contents of each of which are herein incorporated by reference.

BACKGROUND

1. Field

Example embodiments relate to a field effect transistor having a germanium nanorod as a channel and a method of manufacturing the same.

2. Description of Related Art

A conventional field effect transistor includes a silicon channel region between a source and a drain on a silicon substrate as a moving path of carriers. In order to turn on the silicon channel region, a predetermined gate voltage must be applied between the source and the drain. As a result, the speed of the device is determined according to the mobility of the main carriers, for example, holes.

The speed of a device that employs a transistor depends on the mobility of the main carriers in the silicon channel, and thus, much research to increase the mobility of the main carriers have been conducted. In order to increase the mobility of the main carriers, germanium, which has a higher mobility than silicon, has been used.

SUMMARY

Example embodiments provide a field effect transistor having a germanium nanorod that may have improved mobility suitable for a high speed operation transistor. Example embodiments also provide a method of manufacturing a field effect transistor having a germanium nanorod and a method of manufacturing the germanium nanorod.

According to example embodiments, a field effect transistor having Ge nanorods may comprise a gate insulation layer on a silicon substrate, at least one nanorod embedded in the gate insulation layer having both ends thereof exposed, a source electrode and a drain electrode connected to opposite sides of the Ge nanorod, and a gate electrode on the gate insulation layer between the source electrode and the drain electrode.

The Ge nanorod may comprise 2 to 5 nanorods separated from each other.

The Ge nanorod may have a diameter of about 1 to about 20 nm.

The Ge nanorod in the channel region may have a circular or an oval cross-section.

The source electrode and the drain electrode may form a Schottky barrier junction with the Ge nanorod, and may be formed of a metal selected from the group consisting of Pt, Ni, Co, V, Yb, and Er.

The gate insulation layer may be a dielectric layer having a dielectric constant higher than that of silicon oxide, and may be formed of one selected from the group consisting of $Si_3N_4$, $Ta_2O_5$, $HfO_2$, $Zr_2O_5$, $Al_2O_3$, $HfO_xN_y$, HfSiO, and HfSiON.

The gate electrode may comprise a first conductive layer formed of one selected from Ta, TaN, and TiN, and a second conductive layer formed of polysilicon on the first conductive layer.

According to example embodiments, a method of manufacturing a field effect transistor may comprise forming an insulating layer and a first silicon layer on a silicon substrate, sequentially forming a SiGe layer and a second silicon layer on the first silicon layer, forming silicon oxide layers by oxidizing the first and second silicon layers and the Si of the SiGe layer on the silicon substrate, and forming the Ge nanorod from the SiGe layer. The method may further comprise forming a source electrode and a drain electrode contacting opposite ends of the Ge nanorod, forming a gate insulation layer that surrounds the Ge nanorod in a region for forming a channel region between the source electrode and the drain electrode, and forming a gate electrode on the gate insulation layer.

The sequentially forming of the SiGe layer and the second silicon layer on the first silicon layer may be repeated 2 to 5 times on the first silicon layer.

The insulating layer may be formed of a material having an etching rate different from that of the silicon oxide layers.

The forming of the source electrode and the drain electrode may comprise forming a first photoresist in the region for forming the channel region, exposing both ends of the Ge nanorod by removing the silicon oxide layers in the regions for forming the source electrode and the drain electrode, and depositing a metal having a work function greater than that of Ge in the regions for forming the source electrode and the drain electrode.

The forming of the gate insulation layer may comprise exposing the Ge nanorod by removing the silicon oxide layer in the region for forming the channel region, and forming the gate insulation layer that surrounds the Ge nanorod using a material having a higher dielectric constant than that of silicon oxide.

The method may further comprise forming a cross-section of the Ge nanorod in the channel region into a circle or an oval shape by annealing the silicon substrate in a $H_2$ or $D_2$ atmosphere prior to forming the gate insulation layer.

The forming of the gate electrode on the gate insulation layer may comprise forming a first conductive layer formed of one selected from Ta, TaN, and TiN and forming a second conductive layer formed of polysilicon on the first conductive layer.

The SiGe layer may have a composition of $Si_{1-x}Ge_x$, where $0.1<x<0.5$.

The gate insulation layer may be formed of silicon oxide, and the forming of the gate electrode on the gate insulation layer may comprise forming a polysilicon layer.

BRIEF DESCRIPTION OF THE DRAWINGS

Example embodiments will be more clearly understood from the following detailed description taken in conjunction with the accompanying drawings.

FIG. 1 is a cross-sectional view of a field effect transistor having a Ge nanorod according to example embodiments; and FIGS. 2 through 10 are perspective views illustrating a method of manufacturing a field effect transistor having a Ge nanorod according to example embodiments.

DETAILED DESCRIPTION OF EXAMPLE EMBODIMENTS

Figure 1:
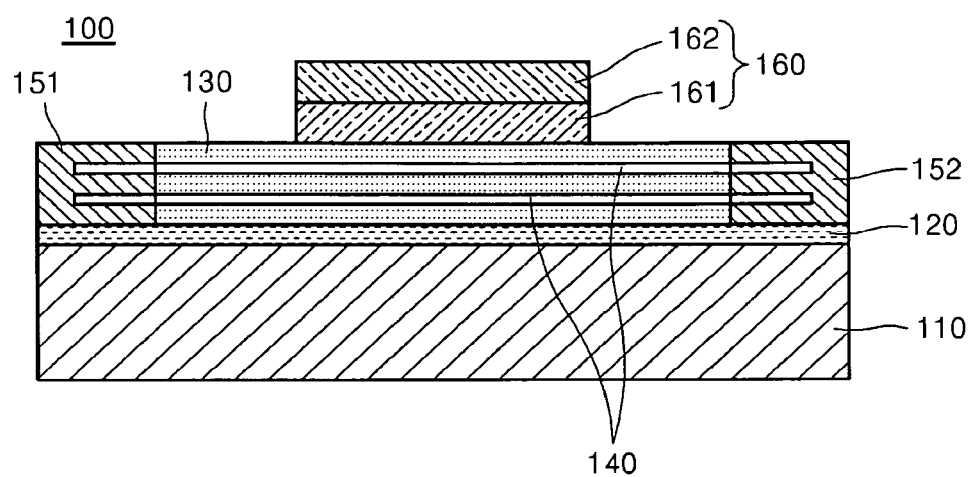
FIGS. 1-10 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a field effect transistor 100 having a Ge nanorod according to example embodiments.

Referring to FIG. 1, an insulating layer 120 may be formed on a silicon substrate 110. A gate insulation layer 130, which may be a dielectric layer having a higher dielectric constant, may be formed on the silicon substrate 110. The gate insulation layer 130 may be formed of $SiO_2$ or a material having a dielectric constant greater than $SiO_2$ (e.g., $Si_3N_4$, $Ta_2O_5$, $HfO_2$, $Zr_2O_5$, $Al_2O_3$, $HfO_xN_y$, HfSiO, or HfSiON). In this case, x and y in $HfO_xN_y$ may be integers.

The insulating layer 120 may be formed of a material having an etching rate different from that of silicon oxide that may be produced in the oxidation process, and may be formed of silicon oxide by oxygen ion implantation or silicon nitride.

Two Ge nanorods 140 separated from each other may be embedded in a horizontal direction, with respect to the silicon substrate 110, in the gate insulation layer 130. The two Ge nanorods 140 may have a circle or an oval cross-section with a diameter of about 1 to about 20 nm. If the cross-section of the Ge nanorods 140 is a circle, an electric field may uniformly enter the Ge nanorods 140, and thus, leakage current may be reduced.

Although the field effect transistor 100 in FIG. 1 may include two Ge nanorods 140, example embodiments are not limited thereto, and 2 to 5 Ge nanorods may be formed parallel to each other. If only one Ge nanorod 140 is formed in the field effect transistor 100, a disconnection failure may occur. If more than 6 Ge nanorods 140 are formed in the field effect transistor 100, the manufacturing process may become more complicated. The Ge nanorods 140 may be channels (e.g., paths of main carriers) in the field effect transistor 100, for example, holes. The Ge nanorods 140 may provide a carrier mobility in a channel region of the field effect transistor 100 higher than that of a conventional field effect transistor.

The gate insulation layer 130 formed of a dielectric having a higher dielectric constant may reduce gate leakage current by surrounding the Ge nanorods 140.

A source electrode 151 and a drain electrode 152, which may be electrically connected to the Ge nanorods 140, may be formed on opposite sides of the Ge nanorods 140. The source electrode 151 and the drain electrode 152 may form a Schottky barrier junction with the Ge nanorods 140. In this case, the source electrode 151 and the drain electrode 152 may be formed of a metal having a work function greater than Ge. Germanides may be formed on contact surfaces between the Ge nanorods 140 and the source electrode 151, and between the Ge nanorods 140 and the drain electrode 152. In order to form a p-type electrode, Pt or Ni may be used, and, in order to form an n-type electrode, Yb or Er may be used.

A gate electrode 160 may be formed on the gate insulation layer 130 between the source electrode 151 and the drain electrode 152. The gate electrode 160 may include a first conductive layer 161 formed of Ta, TaN, or TiN and a second conductive layer 162 formed of polysilicon. If the gate insulation layer 130 is formed of $SiO_2$, the gate electrode 160 may include only the second conductive layer 162. Also, if the gate insulation layer 130 is formed of a material having a dielectric constant higher than $SiO_2$ (e.g., $Si_3N_4$, $Ta_2O_5$, $HfO_2$, $Zr_2O_5$, $Al_2O_3$, $HfO_xN_y$, HfSiO, or HfSiON), the gate electrode 160 may have a structure in which the first conductive layer 161 and the second conductive layer 162 are stacked. X and y in $HfO_xN_y$ may be integers. The second conductive layer 162 may reduce the depletion region in the channel region, thereby facilitating the formation of the channel.

In the field effect transistor 100 according to example embodiments, because the gate insulation layer 130 formed of a higher dielectric material may be disposed around the Ge nanorods 140, channel opening may be easier when a gate voltage is applied to the gate electrode 160, thereby reducing the driving voltage. Also, because the Ge nanorods 140 having a higher mobility than silicon may be used in the field effect transistor 100, the speed of a device including the field effect transistor 100 according to example embodiments may be increased.

A method of manufacturing the field effect transistor 100 having the Ge nanorods 140 and a method of manufacturing the Ge nanorods 140 according to example embodiments will now be described.

FIGS. 2 through 10 are perspective views illustrating a method of manufacturing the field effect transistor 100 having the Ge nanorods 140. The same reference numerals are used to indicate elements that are substantially similar to the elements of FIG. 1, and thus, a detailed description thereof will be omitted.

Figure 2:
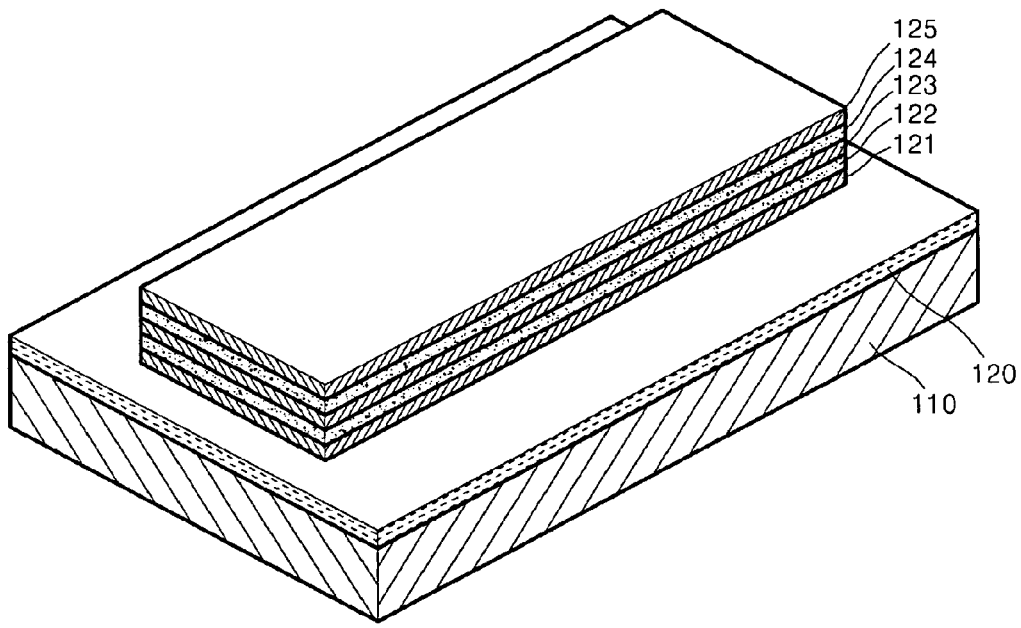

Referring to FIG. 2, an insulating layer 120 having an etching rate different from silicon oxide, which may be formed in a process of oxidizing silicon, may be formed on a silicon substrate 110. A first silicon layer 121 may be formed on the insulating layer 120. The insulating layer 120 may be a silicon oxide layer of a silicon on insulator (SOI) substrate formed by implanting oxygen in the silicon substrate 110 or a silicon nitride layer.

SiGe layers 122 and 124 and second silicon layers 123 and 125 may then be alternately formed on the first silicon layer 121. In FIG. 2, the SiGe layers and the second silicon layers may be alternately deposited twice on the first silicon layer 121, for example, and the SiGe layers and the second silicon layers may be alternately deposited 2 to 5 times on the first silicon layer 121. The SiGe layers 122 and 124 and the silicon layers 121, 123, and 125 may be formed using a chemical vapour deposition (CVD) method.

The SiGe layers 122 and 124 may have a composition of $Si_{1-x}Ge_x$, where x may be about 0.1 to about 0.5, and may be deposited to a thickness of about 1 to about 20 nm. The silicon layers 121, 123, and 125 may also be formed to a thickness of about 1 to about 20 nm. The resultant product as illustrated in FIG. 2 may be obtained by patterning the silicon layers 121, 123, and 125 and the second silicon layers 123 and 125.

Figure 3:
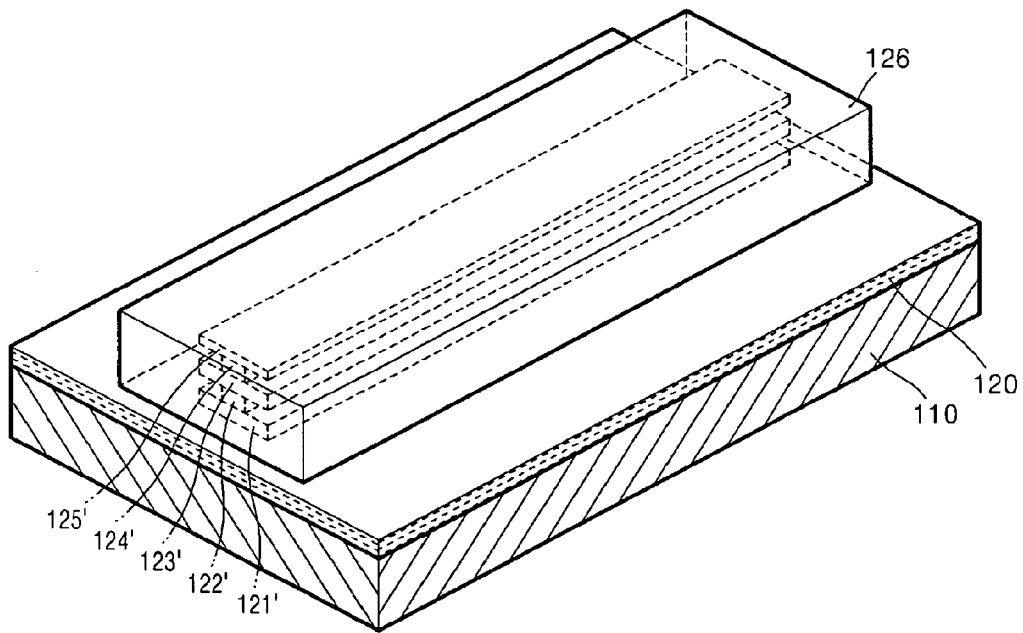

Referring to FIG. 3, the resultant product of FIG. 2 may be annealed in a furnace at a temperature of about 800 to 900° C. for about 1 to 5 minutes under an oxygen atmosphere. The silicon layers 121, 123, and 125 and the SiGe layers 122 and 124 may be partly oxidized. As a result, silicon layers 121', 123', and 125' formed by the oxidation may have a reduced width. In the SiGe layers 122 and 124, Si may be separated from Ge and may be oxidized. As a result, only Ge layers 122' and 124' having a rod shape may remain. This result may indicate that the SiGe layers 122 and 124 may be oxidized faster than the silicon layers 121, 123, and 125. Thus, the SiGe layers 122 and 124 may become Ge nanorods 122' and 124' (corresponding to the Ge nanorods 140 of FIG. 1) that may function as channels. Reference numeral 126 indicates a $SiO_2$ region formed due to the oxidation of the silicon layers 121, 123, and 125 and the Si of the SiGe layers 122 and 124.

Figure 4:
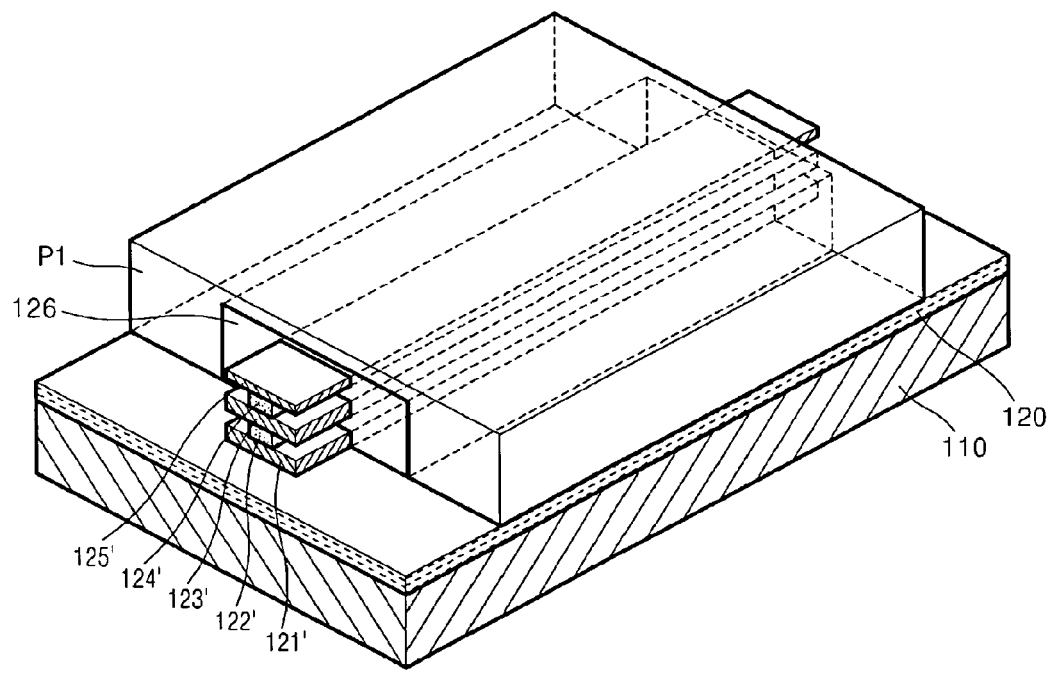

Referring to FIG. 4, after a first photoresist P1 is formed in a region between the regions for forming the source and drain electrodes on the silicon substrate 110, $SiO_2$ that may not be covered by the first photoresist P1 may be removed by wet etching.

Figure 5:
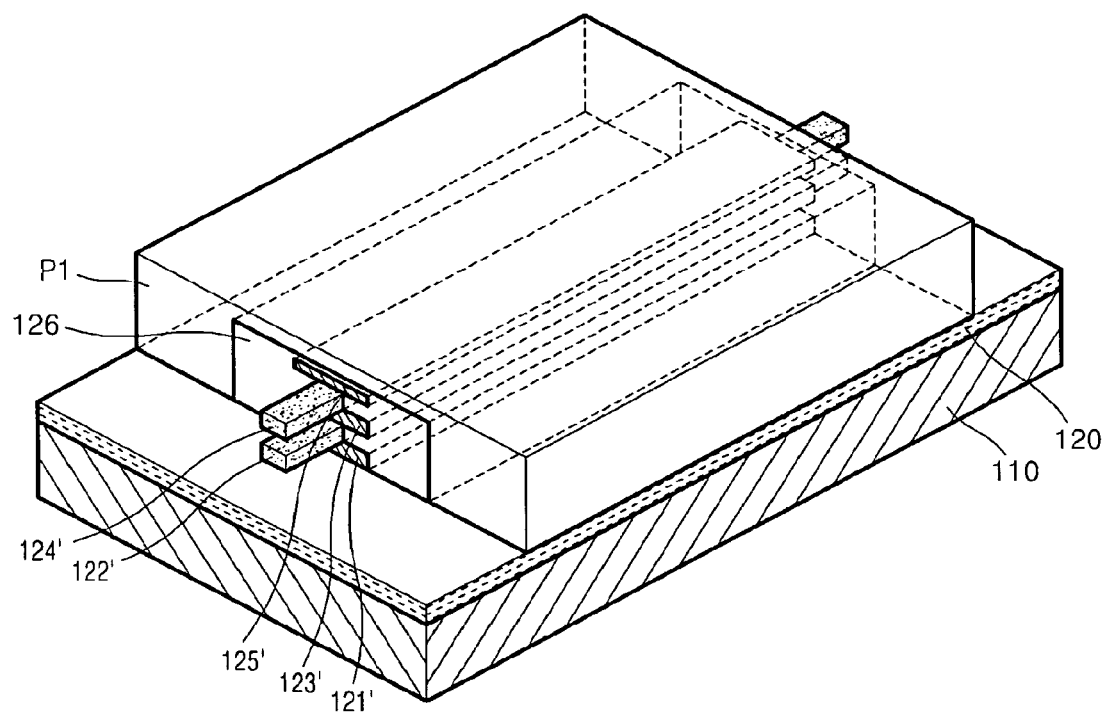

Referring to FIG. 5, the resultant product in FIG. 4 may be annealed in a furnace at a temperature of about 800 to 900° C. for about 1 to 5 minutes under an oxygen atmosphere. The silicon layers 121', 123', and 125' in the regions for forming the source and drain electrodes may be oxidized, and may be removed in the subsequent etching process. Both ends of the nanorods 122' and 124' in the regions for forming the source and drain electrodes may be exposed.

Figure 6:
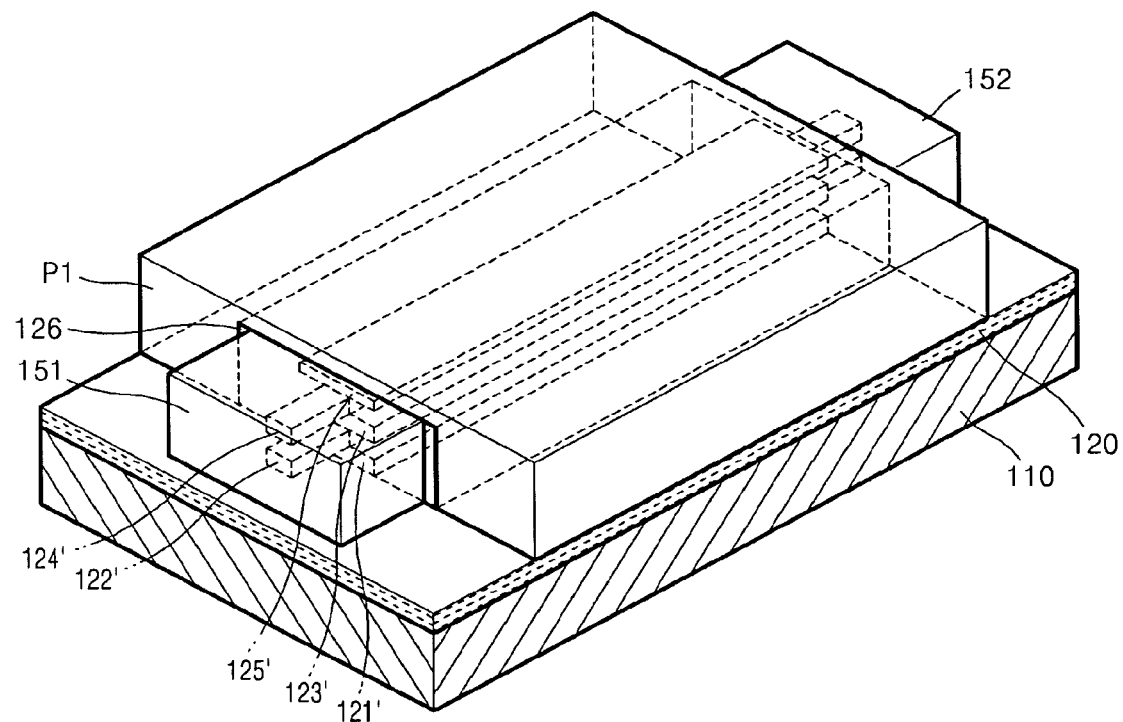

Referring to FIG. 6, a source electrode 151 and a drain electrode 152 may be formed by depositing a metal in the regions for forming the electrodes. At this point, the source electrode 151 and the drain electrode 152 may be formed of a metal having a work function greater than Ge so as to form a Schottky barrier junction therebetween. The Ge nanorods 122' and 124' and the source electrode 151 and the drain electrode 152 may form a germanide on the contact region therebetween. In order to form a p-type electrode, Pt or Ni may be used, and in order to form an n-type electrode, Yb or Er may be used.

Figure 7:
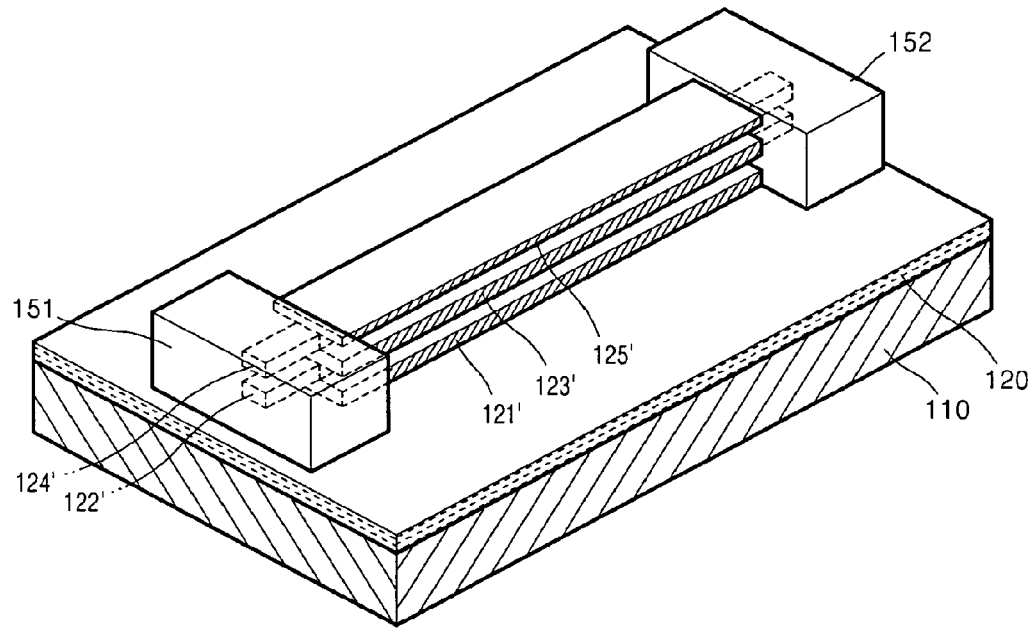

Referring to FIG. 7, the first photoresist P1 (refer to FIG. 6) may be removed, and $SiO_2$ 126 (refer to FIG. 6) covering the region for forming a channel may be etched by wet etching.

The silicon layers 121', 123', and 125' in the regions for forming electrodes may then be oxidized into a first silicon oxide (not shown) by annealing the silicon substrate 110. After a second silicon oxide layer (not shown) is formed on the silicon substrate 110 to cover the first silicon to form the gate insulation layer 130 (refer to FIG. 1), the gate electrode 160 (refer to FIG. 1) may be formed on the gate insulation layer. The gate electrode 160 may be formed as a monolayer using polysilicon.

Figure 8:
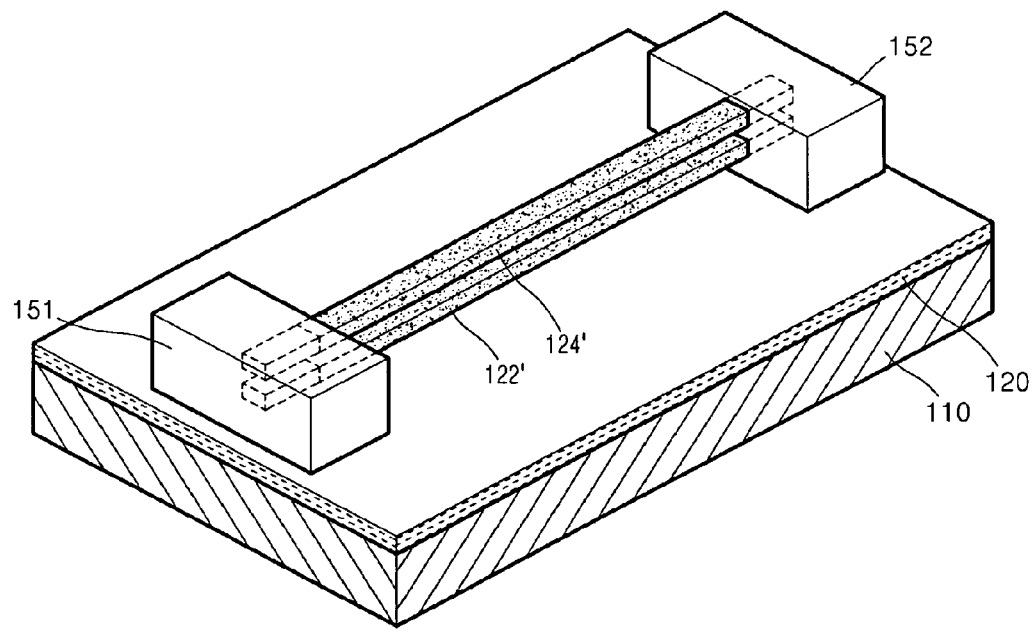

Alternatively, the gate insulation layer may be formed of a material having a dielectric constant greater than that of the silicon oxide layer. Referring to FIG. 8, the first silicon oxide formed by oxidizing the silicon layers 121', 123', and 125' in the regions for forming electrodes may be removed by etching.

Figure 9:
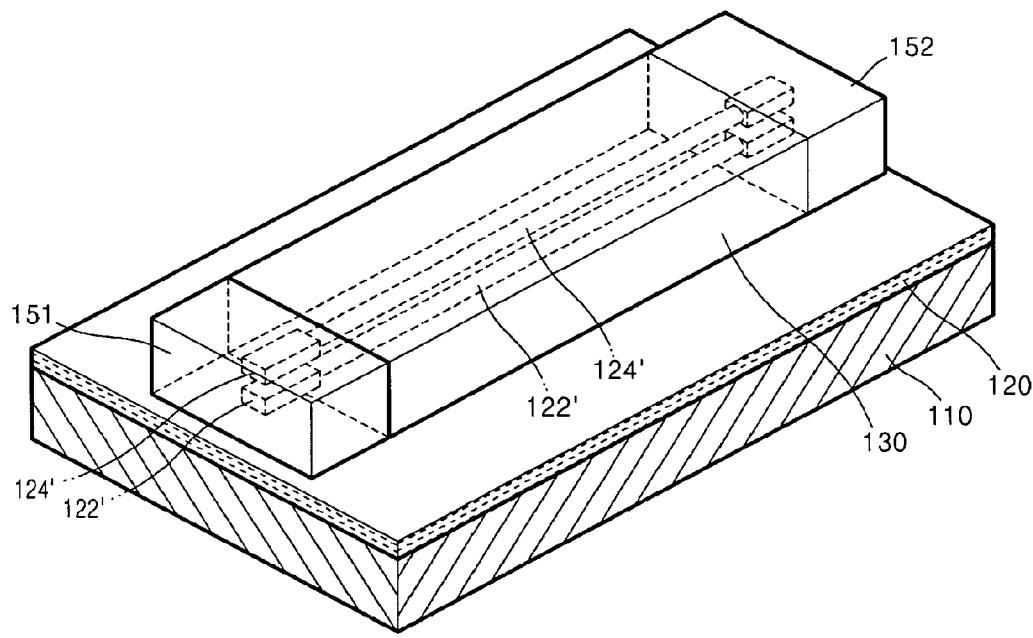

Referring to FIG. 9, the silicon substrate 110 may be annealed under an atmosphere of $H_2$ or $D_2$ at a partial pressure of about 2% to about 5% of the total pressure. As a result, cross-sections of the Ge nanorods 122' and 124' may have a circle or an oval shape.

The gate insulation layer 130 may then be formed using a higher dielectric material (e.g., one material selected from $Si_3N_4$, $Ta_2O_5$, $HfO_2$, $Zr_2O_5$, $Al_2O_3$, $HfO_xN_y$, HfSiO, and HfSiON) in the region for forming a channel. The gate insulation layer 130 may be formed to surround the Ge nanorods 122' and 124'.

Figure 10:
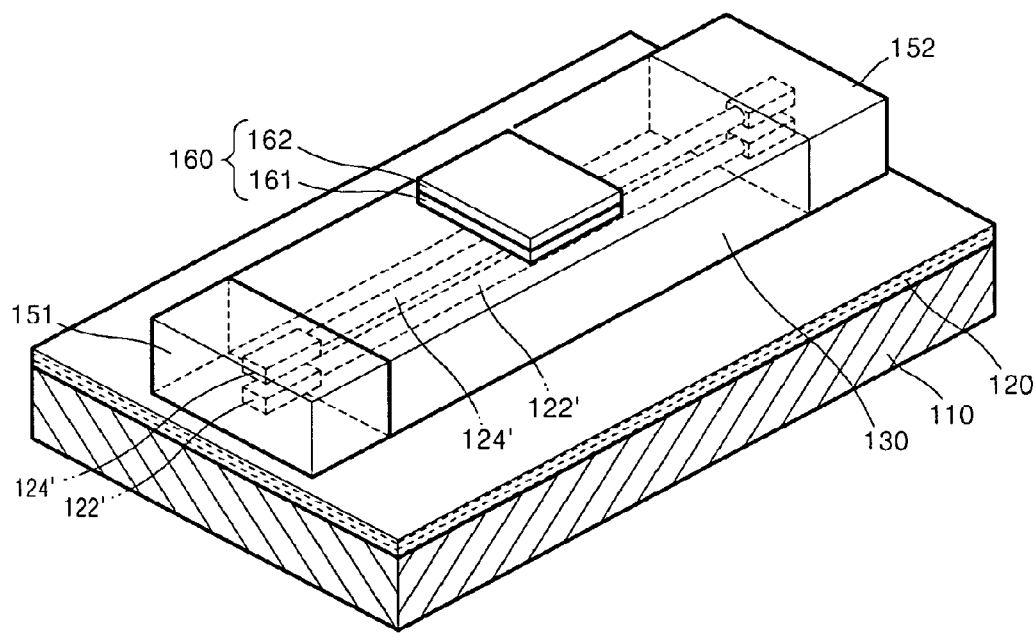

Referring to FIG. 10, a gate electrode 160 may be formed on the gate insulation layer 130. The gate electrode 160 may include a first conductive layer 161 formed of one material selected from Ta, TaN, and TiN and a second conductive layer 162 formed of polysilicon on the first conductive layer 161.

A field effect transistor according to example embodiments may include Ge nanorods having a mobility greater than silicon as a channel, thereby increasing the driving speed and reducing the driving voltage of a device including the field effect transistor.

Also, a p-type transistor or an n-type transistor may be formed according to the material used to form the electrodes. Because in example embodiments, Ge nanorods may be used as a channel, a higher speed and lower power consumption transistor may be developed.

In a method of manufacturing a field effect transistor according to example embodiments, the Ge nanorods, which may be a channel region, may be readily formed using an oxidation process and an etching process.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a field effect transistor, the method comprising:
    forming an insulating layer and a first silicon layer on a silicon substrate;
    sequentially forming at least two alternating SiGe layers and second silicon layers on the first silicon layer after the forming an insulating layer and a first silicon layer;
    forming silicon oxide layers by oxidizing the first and second silicon layers and Si of the at least two SiGe layers on the silicon substrate, and forming at least two Ge nanorods from the at least two SiGe layers;
    forming a source electrode on one end of each of the at least two Ge nanorods, the one end of the at least two Ge nanorods being embedded in the source electrode;
    forming a drain electrode on another end of each of the at least two Ge nanorods, the one end of the at least two Ge nanorods being embedded in the drain electrode;
    forming a gate insulation layer that surrounds the at least two Ge nanorods in a region for forming a channel region between the source electrode and the drain electrode; and
    forming a gate electrode on the gate insulation layer.

2. The method of claim 1, wherein the sequentially forming of the at least two alternating SiGe layers and the second silicon layers includes forming from 2 to 5 SiGe layers separated by the second silicon layers on the first silicon layer.

3. The method of claim 1, wherein the insulating layer is formed of a material having an etching rate different from that of the silicon oxide layers.

4. The method of claim 1, wherein forming the source electrode and the drain electrode comprises:
    forming a first photoresist in the region for forming the channel region;
    exposing both ends of the at least two Ge nanorods by removing the silicon oxide layers in regions for forming the source electrode and the drain electrode; and
    depositing a metal having a work function greater than that of Ge in the regions for forming the source electrode and the drain electrode.

5. The method of claim 1, wherein forming the gate insulation layer comprises:
    exposing the at least two Ge nanorods by removing the silicon oxide layers in the region for forming the channel region; and
    forming the gate insulation layer that surrounds the at least two Ge nanorods using a material having a dielectric constant higher than that of silicon oxide.

6. The method of claim 5, further comprising:
    forming a cross-section of each of the at least two Ge nanorods in the channel region into a circle or an oval shape by annealing the silicon substrate at least two Ge nanorods in a $H_2$ or $D_2$ atmosphere prior to forming the gate insulation layer.

7. The method of claim 5, wherein the material is one selected from the group consisting of $Si_3N_4$, $Ta_2O_5$, $HfO_2$, $Zr_2O_5$, $Al_2O_3$, $HfO_xN_y$, HfSiO, and HfSiON.

8. The method of claim 7, wherein the forming of the gate electrode comprises forming a first conductive layer formed of one selected from Ta, TaN, and TiN and forming a second conductive layer formed of polysilicon on the first conductive layer.

9. The method of claim 1, wherein each of the at least two SiGe layers has a composition of $Si_{1-x}Ge$, where $0.1<x<0.5$.

10. The method of claim 1, wherein the source electrode and the drain electrode are formed of a metal selected from the group consisting of Pt, Ni, Co, V, Yb, and Er.

11. The method of claim 1, wherein the gate insulation layer is formed of silicon oxide, and the forming of the gate electrode comprises forming a polysilicon layer.

12. The method of claim 1, wherein the at least two Ge nanorods have a diameter of about 1 to about 20 nm.

13. The method of claim 1, wherein the first silicon layer, the at least two alternating SiGe layers and the second silicon layers are formed overlapping the insulating layer.

* * * * *